United States Patent [19]
Roesner

[11] Patent Number: 5,095,362
[45] Date of Patent: Mar. 10, 1992

[54] METHOD FOR REDUCING RESISTANCE FOR PROGRAMMED ANTIFUSE

[75] Inventor: Bruce B. Roesner, Poway, Calif.
[73] Assignee: Instant Circuit Corporation, San Diego, Calif.
[21] Appl. No.: 604,133
[22] Filed: Oct. 23, 1990
[51] Int. Cl.⁵ .................... H01L 29/10; G11C 17/00
[52] U.S. Cl. .................. 357/23.4; 357/23.6; 357/51; 365/100
[58] Field of Search ........... 357/23.4, 23.6, 51; 365/100

[56] References Cited
U.S. PATENT DOCUMENTS
4,442,507 4/1984 Roesner .......................... 357/51

Primary Examiner—Edward J. Wojciechowicz
Attorney, Agent, or Firm—Daniel L. Dawes

[57] ABSTRACT

A Read-Only Memory is comprised of a plurality of memory cells. An antifuse film is disposed between and in contact with an underlying heavily N-doped word line layer and an overlying metallic address line layer. The word line is disposed on an insulating semiconductor substrate and is in contact with a surrounding oxide layer. The programmable material is irreversibly configured between the two resistivity states by application of a threshold voltage. The threshold voltage alters the electrical state of the programmable material only in the proximity of that portion of the programmable material to which the threshold voltage has been applied. The resistivity of the low resistivity state is selectively decreased by implanting nonactivated conductive dopants into film. These dopants are characterized by having a nonactivated state where the conduction of carriers in the film is not enhanced, and an activated state where the conduction of carriers in the film is enhanced. The dopants are configured from the nonactivated state into the activated state by application of the same threshold voltage that is applied across the antifuse film to program the material.

18 Claims, 1 Drawing Sheet

METHOD FOR REDUCING RESISTANCE FOR PROGRAMMED ANTIFUSE

BACKGROUND OF THE INVENTION

1. Field of the Invention

This invention relates to the field of semiconductor memories as fabricated in integrated circuits and more particularly to the antifuse structure used within a read-only memory and a method for reducing the electrical resistivity of the antifuse in its programmed state.

2. Description of the Prior Art

An antifuse is defined herein as a substantially nonconductive structure that is capable of becoming substantially conductive upon application of a certain voltage.

Examples of the antifuse and it use as a memory cell within a Read-Only Memory are discussed in Roesner, "*Method of Fabricating a High Density Programmable Read-Only Memory*", U.S. Pat. No. 4,796,074 (1989) and Roesner, "*Electrically Programmable Read-Only Memory Stacked above a Semiconductor Substrate*", U.S. Pat. No. 4,442,507 (1984), each of which references are herein expressly incorporated by reference.

A typical antifuse structure is formed by disposing a layer of heavily N-doped word line on an insulating substrate, disposing an antifuse layer of lightly N-doped programmable material within an etched cavity in an overlying oxide layer, and disposing a metallic address line upon and connected to the antifuse layer.

The programmable material used for the antifuse layer might be selected from the group of silicon, germanium, carbon and alpha-tin. The properties of the programmable material are such that the material exhibits a relatively high resistance as long as the voltage across it does not exceed a threshold level. However, once the threshold voltage is exceeded, the resistance of material irreversibly switches form a high resistance state to a relatively low resistance state.

Antifuse structures as described above and in previous patents '507 and '074 operate by forming a conductive filament in an initially nonconductive film. The antifuse has a very high resistance initially for two reasons. First, the film is amorphous, resulting in very low electron mobility. Second, any conductive elements or dopants which exist in the film have not been activated and therefore do not enhance the conduction of carriers in the film.

To program or change the resistance of the antifuse from a very high level (greater than 100,000,000 ohms) to a low level (less than 1000 ohms), a voltage of sufficiently high electrical field strength is placed across the antifuse film to cause dielectric breakdown. As breakdown occurs electrical current will flow through one small region of the film. The current is limited by the resistance of the filament itself as well as any series resistance of conductive layers or logic devices (transistors) in series with the antifuse. This flow of current in a very small area converts the region from amorphous to single crystalline material and at the same time activates any residual carriers.

It is desirable to reduce the resistance of the programmed antifuse to as low a level as possible since the higher resistance is more restrictive to electrical signals passing through it. In other words, higher resistance connections cause circuits to operate at slower speeds.

The resistance of a programmed antifuse can be reduced by either increasing the actual size of the antifuse filament or decreasing the resistivity of the filament material itself. In order to increase the size of the filament, more current during programming is required. This actually increases the amount of energy released in the filament which causes a larger area to be altered to single crystalline. Such a technique is presently being used to reduce the resistance in those applications where the lower resistance is critical.

The electrical characteristics of an antifuse prior to programming are typically not identical when measured in the forward and reverse directions. In this context the forward direction is the direction that current flows when a positive voltage is applied to the top node of the antifuse, e.g. the metallization, while the opposing end of the antifuse or bottom conductor is grounded. The reverse direction is the direction of current flow when a negative voltage is applied to the top node and the opposing end of the antifuse or bottom conductor is grounded. For example, if the forward programming voltage is 10 volts, the reverse programming voltage will typically be 12 volts. Asymmetrical programming voltages can be undesirable is some applications. The higher reverse voltage must be accommodated for the circuit design, which can be a burdensome design requirement to implement. A lower forward programming voltage places an upper limit on the operational voltage of the circuit if inadvertent programming of the antifuses are to be avoided.

Accordingly, what is needed is a method of decreasing the resistivity of the filament material in the antifuse in its programmed state. What is also needed is a method of obtaining the decreased resistivity of the programmed antifuse without also significantly decreasing the resistivity of the antifuse in its initial state prior to being programmed. What is further needed is a compatible methodology and structure for making the forward and reverse programming voltages symmetrical.

BRIEF SUMMARY OF THE INVENTION

The invention is a method of fabricating a layer of programmable material within an antifuse which exhibits relatively lower than normal resistance in its programmed state. This is accomplished by enhancing the antifuse film with carriers which become activated during the programming current pulse.

It is important that the implantation means for introducing carriers into the antifuse film are provided in such a way that the film will not be transformed into its conductive state until activation occurs by application of a threshold voltage. If the process to place carriers into the film also activates the carriers, even partially, the resistance of the unprogrammed antifuse will decrease. Such a reduction in the initial resistance is undesirable, although it certainly might be acceptable for certain applications.

One preferred method of doping antifuse film includes ion implantation of carriers selected from the group consisting of boron, phosphorous and arsenic being used to insert nonactivated carriers into the antifuse film.

The invention is an improved semiconductor device comprising an antifuse film of the type composed of semiconductor material having a first electrical state which is characterized by high electrical resistivity and a second electrical state which is characterized by low electrical resistivity. The material is electrically and permanently configured to the second electrical state from the first electrical state upon application of a voltage exceeding a predetermined threshold voltage applied across at least a portion of the material. Only that portion subjected to the threshold voltage is configured from the first state to the second state. The remaining portion of the material, which is not exposed to the threshold voltage, remains in the first state.

An element is provided for selectively decreasing the resistivity of the second electrical state of the portion of the material.

The element for selectively decreasing resistivity comprises nonactivated conductive dopants disposed within the material. The dopants are characterized by having a nonactivated state wherein the dopants do not enhance the conduction of carriers in the film. The dopants are further characterized by having an activated state wherein the dopants enhance the conduction of carriers in the film. The dopants are configured from the nonactivated state into the activated state upon application of a threshold voltage being applied across a predetermined and selected portion of the material in which the dopants are disposed.

The dopants are ion implanted. The dopants are selected from the group consisting of boron, phosphorous, and arsenic.

The invention is still further a method of reducing the electrical resistivity of a second electrical state of antifuse semiconductor material described as above. The method comprises the steps of implanting nonactivated conductive dopants into the material. The dopants are characterized by having a nonactivated state wherein the dopants do not enhance the conduction of carriers in the film. The dopants are further characterized by having an activated state wherein the dopants enhance the conduction of carriers in the film. The dopants are configured from the nonactivated state into the activated state upon application of the threshold voltage applied across a predetermined and selected portion of the material in which the dopants are disposed. The threshold voltage is applied across the predetermined and selected portion of the material to activate a corresponding selected portion of the dopants implanted into the material.

The step of implanting dopants comprises implanting ions of dopants.

The dopants are selected from the group consisting of boron, phosphorous and arsenic.

The method further comprises the step of applying the threshold voltage across the predetermined and selected portion of the material to ohmically heat the portion to a predetermined degree to activate the dopants.

The invention is still further characterized as an improved electrical programmable read-only memory of the type having a semiconductor substrate, a plurality of conductive word lines disposed on the substrate, an oxide layer of material disposed between the plurality of word lines and on the substrate, and a plurality of antifuse films each disposed on one of the plurality of word lines in electrical contact with the word line. The antifuse film is composed of semiconductor material having a first electrical state which is characterized by high electrical resistivity and a second electrical state which is characterized by low electrical resistivity. The material is electrically and permanently configured to the second electrical state from the first electrical state upon application of a voltage exceeding a predetermined threshold voltage applied across at least a portion of the material. Only that portion subjected to the threshold voltage is configured from the first state to the second state. The remaining portion of the material, which is not exposed to the threshold voltage, remains in the first state. A plurality of conductive bit lines are each disposed on one of the antifuse films and aligned at least with one of the word lines. The improvement comprises nonactivated conductive dopants implanted and dispersed within the antifuse film. The dopants are characterized by having a nonactivated state wherein the dopants do not enhance the conduction of carriers in the film. The dopants are further characterized by having an activated state wherein the dopants do enhance the conduction of carriers in the film. The dopants are configured from the nonactivated state into the activated state upon application of the threshold voltage applied across a predetermined and selected portion of the material in which the dopants are disposed.

The invention is also an improved semiconductor device comprising an antifuse film of the type composed of semiconductor material having a first electrical state which is characterized by high electrical resistivity and a second electrical state which is characterized by low electrical resistivity. The material is electrically and permanently configured to the second electrical state from the first electrical state upon application of a voltage exceeding a predetermined threshold voltage applied across at least a portion of the material. Only that portion which is subjected to the threshold voltage is configured from the first state to the second state. The remaining portion of the material, which is not exposed to the threshold voltage, remains in the first state. An element is provided for balancing the forward and reverse programming voltage across the antifuse film.

The element for balancing forward and reverse programming voltage across the antifuse film comprises ion implanted dopants dispersed within a shallow upper interface portion of the material. The conductivity type and dosage of the dopants are selected so that forward and reverse programming voltages are substantially balanced or equal.

The invention is also an improvement in a method of balancing forward and reverse programming voltages across a semiconductor material. As before, the material has a first electrical state which is characterized by high electrical resistivity and the second electrical state being characterized by low electrical resistivity. The material is electrically and permanently configured to the second electrical state from the first electrical state upon application of a voltage exceeding a predetermined threshold voltage applied across at least a portion of the material. Only that portion being subject to the threshold voltage is configured from the first state to the second state. The remaining portion of the material, which is not exposed to the threshold voltage, remains in the first state. The improvement comprises the step of shallowly ion implanting dopants into an upper interface portion of the material. The dopants are characterized by a conductivity type and dosage so that the threshold voltage is substantially equal regardless of direction of potential gradient across the material.

The invention may better be visualized by viewing the following drawings.

DETAILED DESCRIPTION OF THE PREFERRED EMBODIMENT

Figure 1:
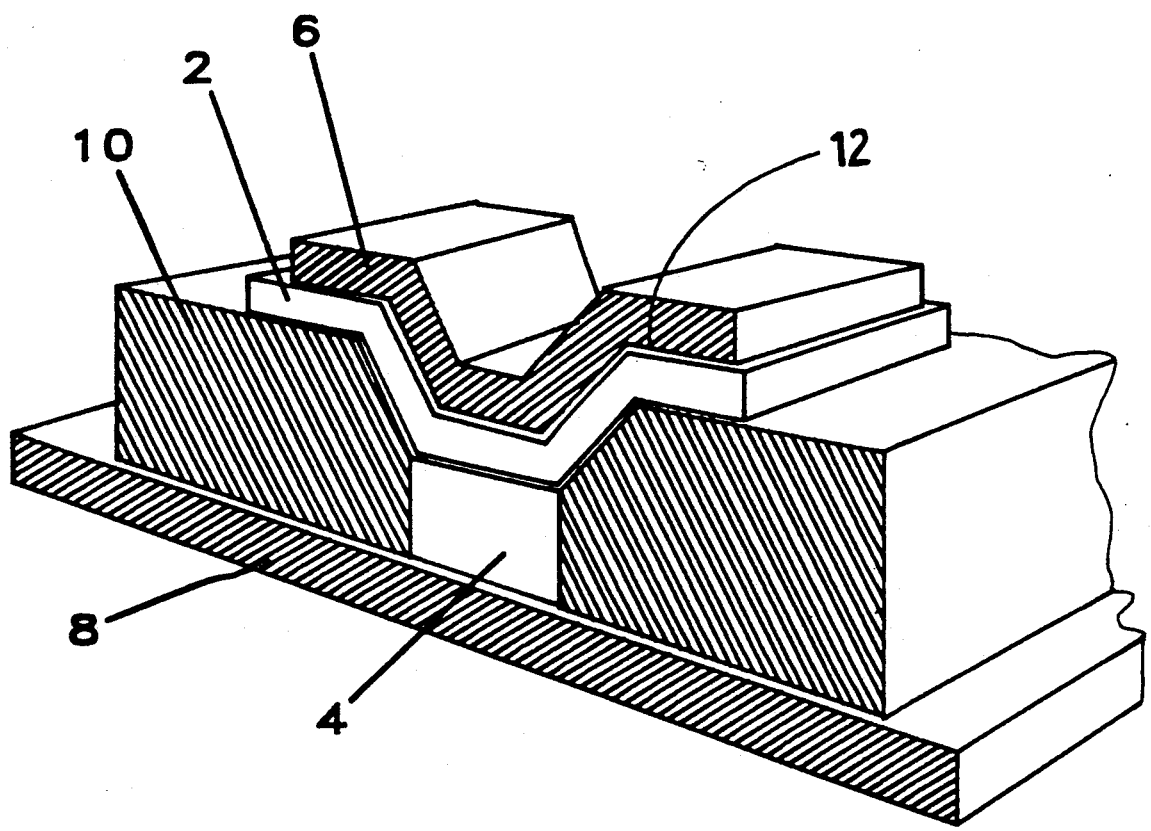
FIG. 1 is a diagrammatic perspective view of one cell of a Read-Only Memory on which the programmable antifuse layer is disposed on a semiconductor substrate between an N-doped word line and a metallic address line within a surrounding oxide layer.

A Read-Only Memory is comprised of a plurality of memory cells, a portion of a typical cell of which is depicted in FIG. 1. An antifuse film 2 is disposed between and in contact with an underlying heavily N-doped word line layer 4 and an overlying metallic address line layer 6. The word line 4 is disposed on an insulating semiconductor substrate 8 and is in contact with a surrounding oxide layer 10.

The programmable material of the antifuse film 2 can be any material that is characterized by a high resistivity state and which is reconfigurable to a low resistivity state. The programmable material is irreversibly configured between the two resistivity states by application of a threshold voltage. The threshold voltage alters the electrical state of the programmable material only in the proximity of that portion of the programmable material to which the threshold voltage has been applied.

Antifuse film 2 preferably consists essentially of a single element semiconductor selected from the group of silicon, germanium, carbon and alpha-tin.

This invention decreases the resistivity of the low resistivity state by implanting nonactivated conductive dopants into film 2. These dopants are characterized by having a nonactivated state where the conduction of carriers in the film is not enhanced, and an activated state where the conduction of carriers in the film is enhanced. The dopants are configured from the nonactivated state into the activated state by application of the same threshold voltage that is applied across the antifuse film to program the material. Preferably, the dopants are implanted into the material in such a way as to keep the dopants in a substantially nonactivated state. And the dopants remain in their nonactivated state until the threshold voltage is applied.

Preferably, ion implantation of carriers selected from the group of boron, phosphorous and arsenic are used to insert nonactivated carriers into film 2.

In an experiment to compare the characteristics of the doped antifuse film of this invention with the undoped film of the prior art, discrete antifuse structures were fabricated in the typical fashion shown in FIG. 1. A silicon substrate 8 had a diffusion performed on its surface in order to form a low resistivity region. Next, an oxide layer 10 was deposited and contacts 4 formed. Antifuse film 2 was then deposited.

The process was then split with respect to subsequent steps of ion implantation of carriers into antifuse film 2. In order to compare the new technique with the old, certain wafers receiving no dopant implants were used as controls. Masking and etching of antifuse layer 2 were performed in order to remove antifuse layer 2 in those contacts which were to be normal ohmic contacts. The process was completed by depositing metal contact 6 on antifuse layer 2, which metal contact 6 was then masked and etched.

When electrically testing the devices, it was found that the resistance prior to programming of the ion implanted structure was unchanged for medium implant doses of $10^{14}$ ions/cm$^2$ when compared to those structure not receiving ion implantation. However, for a given programming current level, the ion implanted devices had post-programming resistances which were lower than the nonimplanted devices. For example, for a programming current level of 3 mA for 300 microseconds, the ion implanted devices had a post-programming resistance of approximately 170 ohms in comparison to approximately 260 ohms for the nonimplanted control devices.

It is entirely within the scope of the present invention that any dopant implantation profiles and concentrations may be utilized, provided that they are sufficiently activated by ohmic heating by selectively applied programming currents. For example, dopant concentrations in the range of $1-4 \times 10^{14}$ ions per cm$^2$ of phosphorous in amorphous silicon activated by programming currents in the range of 0.25–10 mA for 5–300 microseconds are preferred although other ranges and values consistent with the teachings of the present invention could be employed.

To make the forward and reverse programming voltages symmetrical the built in or inherent potential of the top interface 12 is altered to allow the forward and reverse characteristics or programming voltage of an unprogrammed antifuse to become the same. Top interface 12 is ion implanted with a very shallow dopant. For example, a phosphorous ion implant of $3 \times 10^{14}$ ions/cm$^2$ at 15 KeV offsets the difference in the forward reverse programming voltages of the antifuse illustrated above. Using other N-type dopants would probably have the same affect, while the use of a P-type dopant would increase the differences in programming voltages. It is to be understood that the dose of implantation will also affect the degree of change in the programming voltage.

The illustrated embodiment has been shown only for purposes of example and should not be taken as limiting the invention which is defined by the following claims which must be construed to include all equivalent means for performing the same function even if not expressly described above. It must be understood that many modifications may be made by those having ordinary skill in the art without departing from the spirit and scope of the invention.

I claim:

1. An improved semiconductor device comprising:
antifuse film of the type composed of semiconductor material having a first electrical state which is characterized by high electrical resistivity and a second electrical state which is characterized by low electrical resistivity, said material being electrically and permanently configured to said second electrical state from said first electrical state upon application of a voltage exceeding a predetermined threshold voltage applied across at least a portion of said material, only that portion being subjected to said threshold voltage being configured from said first state to said second state, the remaining portion of said material, which is not exposed to said threshold voltage, remaining in said first state; and means for selectively decreasing the resistivity of said second electrical state of said portion of said material without decreasing the resistivity of said first electrical state before selective activation of said portion of said material to said second electrical state, wherein said means for selectively decreasing resistivity comprises deliberately added nonactivated conductive dopants dispersed within said material, said dopants characterized by having a nonactivated state wherein said dopants do not enhance the conduction of carriers in said film, said dopants further characterized by having an activated state wherein said dopants enhance the conduction of carriers in said film, said dopants being configured from said nonactivated state into said activated state upon application of a threshold voltage being applied across a predetermined and selected portion of said material in which said dopants are disposed.

2. The improved antifuse film of claim 1 wherein said dopants are ion implanted.

3. The improved antifuse film of claim 2 wherein said dopants are selected from the group consisting of boron, phosphorous, and arsenic.

4. An antifuse film comprising:
semiconductor material having a first electrical state which is characterized by high electrical resistivity and a second electrical state which is characterized by low electrical resistivity, said material being electrically and permanently configured to said second electrical state from said first electrical state upon application of a voltage exceeding a predetermined threshold voltage applied across at least a portion of said material, only that portion being subjected to said threshold voltage being configured from said first state to said second state, the remaining portion of said material, which is not exposed to said threshold voltage, remaining in said first state; and
deliverately added nonactivated conductive dopants dispersed within said semiconductor material, said dopants characterized by having a nonactivated state wherein said dopants do not enhance the conduction of carriers in said film, said dopants further characterized by having an activated state wherein said dopants do enhance the conduction of carriers in said film, said dopants being configured from said nonactivated state into said activated state upon application of said threshold voltage being applied across a predetermined and selected portion of said material in which said dopants are disposed.

5. A method of reducing the electrical resistivity of a second electrical state of semiconductor material, said material having a first electrical state which is characterized by high electrical resistivity and said second electrical state being characterized by low electrical resistivity, said material being electrically and permanently configured to said second electrical state from said first electrical state upon application of a voltage exceeding a predetermined threshold voltage applied across at least a portion of said material, only that portion being subject to said threshold voltage being configured from said first state to said second state, the remaining portion of said material, which is not exposed to said threshold voltage, remaining in said first state, said method comprising the steps of:
implanting nonactivated conductive dopants into said material, said dopants characterized by having a nonactivated state wherein said dopants do not enhance the conduction of carriers in said film, said dopants further characterized by having an activated state wherein said dopants do enhance the conduction of carriers in said film, said dopants being configured from said nonactivated state into said activated state upon application of said threshold voltage being applied across a predetermined and selected portion of said material in which said dopants are disposed; and
applying said threshold voltage across said predetermined and selected portion of said material to activate a corresponding selected portion of said dopants implanted into said material.

6. The method of claim 5 wherein said step of implanting dopants comprises the step of ion implantation.

7. The method of claim 6 wherein said dopants are selected from the group consisting of boron, phosphorous and arsenic.

8. A method of creating an antifuse film composed of semiconductor material having a first electrical state which is characterized by high electrical resistivity and a second electrical state which is characterized by low electrical resistivity, said material being electrically and permanently configured to said second electrical state from said first electrical state upon application of a voltage exceeding a predetermined threshold voltage applied across at least a portion of said material, only that portion being subjected to said threshold voltage being configured from said first state to said second state, the remaining portion of said material, which is not exposed to said threshold voltage, remaining in said first state, comprising the steps of:
providing said material from essentially a single element semiconductor selected from a group of silicon, germanium, carbon and alpha-tin; and
implanting nonactivated conductive dopants into said material, said dopants characterized by having a nonactivated state wherein said dopants do not enhance the conduction of carriers in said film, said dopants further characterized by having an activated state wherein said dopants do enhance the conduction of carriers in said film, said dopants being configured from said nonactivated state into said activated state upon application of said threshold voltage being applied across a predetermined and selected portion of said material in which said dopants are disposed.

9. The method of claim 8 further comprising the step of
applying said threshold voltage across said predetermined and selected portion of said material to ohmically heat said portion to a predetermined degree to activate said dopants.

10. The method of claim 8 wherein said step of implanting dopants comprises the step of ion implantation.

11. The method of claim 10 wherein said dopants are selected from the group consisting of boron, phosphorous and arsenic.

12. An improved electrical programmable read-only memory of the type having:
a semiconductor substrate;
a plurality of conductive word lines disposed on said substrate;
an oxide layer of material disposed between said plurality of word lines and on said substrate;
a plurality of antifuse films each disposed on one of said plurality of word lines in electrical contact with said word line, said antifuse film composed of semiconductor material having a first electrical state which is characterized by high electrical resistivity and a second electrical state which is characterized by low electrical resistivity, said material being electrically and permanently configured to said second electrical state from said first electrical state upon application of a voltage exceeding a predetermined threshold voltage applied across at least a portion of said material, only that portion being subjected to said threshold voltage being configured from said first state to said second state, the remaining portion of said material, which is not exposed to said threshold voltage, remaining in said first state;

a plurality of conductive bit lines each disposed on one of said antifuse films and aligned at least with one of said word lines, wherein the improvement comprises:

nonactivated conductive dopants deliberately implanted and dispersed within said antifuse film, said dopants characterized by having a nonactivated state wherein said dopants do not enhance the conduction of carriers in said film, said dopants further characterized by having an activated state wherein said dopants do enhance the conduction of carriers in said film, said dopants being configured from said nonactivated state into said activated state upon application of said threshold voltage being applied across a predetermined and selected portion of said material in which said dopants are disposed.

13. The improved read-only memory of claim 12 wherein said dopants are selected from the group consisting of boron, phosphorous and arsenic.

14. An improved semiconductor device comprising:
antifuse film of the type composed of semiconductor material having a first electrical state which is characterized by high electrical resistivity and a second electrical state which is characterized by low electrical resistivity, said material being electrically and permanently configured to said second electrical state from said first electrical state upon application of a voltage exceeding a predetermined threshold voltage applied across at least a portion of said material, only that portion being subjected to said threshold voltage being configured from said first state to said second state, the remaining portion of said material, which is not exposed to said threshold voltage, remaining in said first state; and means for balancing forward and reverse programming voltage across said antifuse film comprising ion implanted dopants dispersed within a shallow upper interface portion of said material, conductivity type and dosage of said dopants being selected so that forward and reverse programming voltages are substantially balanced.

15. The device of claim 14 further comprising:

means for selectively decreasing the resistivity of said second electrical state of said portion of said material.

16. The device of claim 1 wherein said means for means for balancing forward and reverse programming voltage across said antifuse film comprises ion implanted dopants dispersed within a shallow upper interface portion of said material, conductivity type and dosage of said dopants being selected so that forward and reverse programming voltages are substantially balanced.

17. An improvement in a method of balancing forward and reverse programming voltages across a semiconductor material, said material having a first electrical state which is characterized by high electrical resistivity and said second electrical state being characterized by low electrical resistivity, said material being electrically and permanently configured to said second electrical state from said first electrical state upon application of a voltage exceeding a predetermined threshold voltage applied across at least a portion of said material, only that portion being subject to said threshold voltage being configured from said first state to said second state, the remaining portion of said material, which is not exposed to said threshold voltage, remaining in said first state, said improvement comprising the step of:

shallowly ion implanting dopants into an upper interface portion of said material to form a high dopant gradient to produce an electric field in said interface portion, said dopants characterized by a conductivity type and dopant gradient so that of forward and reverse programming threshold voltages of said semiconductor material are alterable, including being set substantially equal absolute magnitudes, regardless of direction of voltage across said material.

18. The improvement of claim 17 further comprising the steps of:

implanting nonactivated conductive dopants into said material, said dopants characterized by having a nonactivated state wherein said dopants do not enhance the conduction of carriers in said film, said dopants further characterized by having an activated state wherein said dopants do enhance the conduction of carriers in said film, said dopants being configured from said nonactivated state into said activated state upon application of said threshold voltage being applied across a predetermined and selected portion of said material in which said dopants are disposed; and applying said threshold voltage across said predetermined and selected portion of said material to activate a corresponding selected portion of said dopants implanted into said material.

* * * * *